United States Patent
Meroni et al.

(12)

(10) Patent No.: US 6,445,324 B1
(45) Date of Patent: Sep. 3, 2002

(54) METHOD FOR DYNAMIC MATCHING OF THE ELEMENTS OF AN INTEGRATED MULTIBIT DIGITAL-TO-ANALOG CONVERTER WITH BALANCED OUTPUT FOR AUDIO APPLICATIONS

(75) Inventors: Cristiano Meroni, Milan; Edoardo Botti, Vigevano; Andrea Baschirotto, Tortona; Massimo Ghioni, Monza, all of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/972,751

(22) Filed: Oct. 5, 2001

(30) Foreign Application Priority Data

Oct. 6, 2000 (IT) ........................................ TO00A0931

(51) Int. Cl.[7] ............................................... H03M 1/66
(52) U.S. Cl. ..................... 341/144; 341/161; 341/143; 341/150; 341/163; 341/155; 341/120; 341/118
(58) Field of Search ............................... 341/143, 144, 341/118, 150, 161, 163

(56) References Cited

U.S. PATENT DOCUMENTS

| | | | | |
|---|---|---|---|---|
| 5,404,142 A | * | 4/1995 | Adams et al. | 341/118 |
| 5,406,283 A | * | 4/1995 | Leung | 341/143 |
| 5,982,317 A | * | 11/1999 | Steensgaard-Madsen | 341/143 |
| 6,137,431 A | * | 10/2000 | Lee et al. | 341/143 |
| 6,184,812 B1 | * | 2/2001 | Younis et al. | 341/143 |
| 6,211,805 B1 | * | 4/2001 | Yu | 341/144 |
| 6,266,002 B1 | * | 7/2001 | Gong et al. | 341/143 |
| 6,317,068 B1 | * | 11/2001 | Gattani et al. | 341/150 |
| 6,348,888 B1 | * | 2/2002 | Yu | 341/143 |

* cited by examiner

*Primary Examiner*—Michael Tokar
*Assistant Examiner*—Lam T. Mai
(74) *Attorney, Agent, or Firm*—Lisa K. Jorgenson; E. Russell Tarleton; SEED IP Law Group PLLC

(57) ABSTRACT

A method for digital-to-analog conversion of a digital input code into a first output analog signal and a second output analog signal to be supplied to a first terminal and a second terminal, respectively, of an audio load, the conversion being performed by means of a DAC with N-level balanced output, the conversion method includes using N/2 positive generator elements supplying respective positive elementary contributions which are nominally equal to one another, and N/2 negative generator elements supplying respective negative elementary contributions which are nominally equal to one another and, in absolute value, equal to the positive elementary contributions; attributing the same progressive addresses to the positive generator elements and to the negative generator elements; defining a first index for the positive input codes and a second index for the negative input codes; and, in the presence of an input code at the input of the DAC, selecting between the first index and the second index, the index corresponding to the sign of the input code; activating a first set of positive generator elements and a second set of negative generator elements, the number of the positive generator elements activated and the number of the negative generator elements activated being equal to one another and proportional to the input code, and the addresses of the positive generator elements activated and of the negative generator elements activated being a function of the selected index; generating the first output analog signal by summing the positive elementary contributions supplied by the positive generator elements activated, and generating the second output analog signal by summing the negative elementary contributions supplied by the negative generator elements activated; and updating the selected index according to the input code.

18 Claims, 6 Drawing Sheets

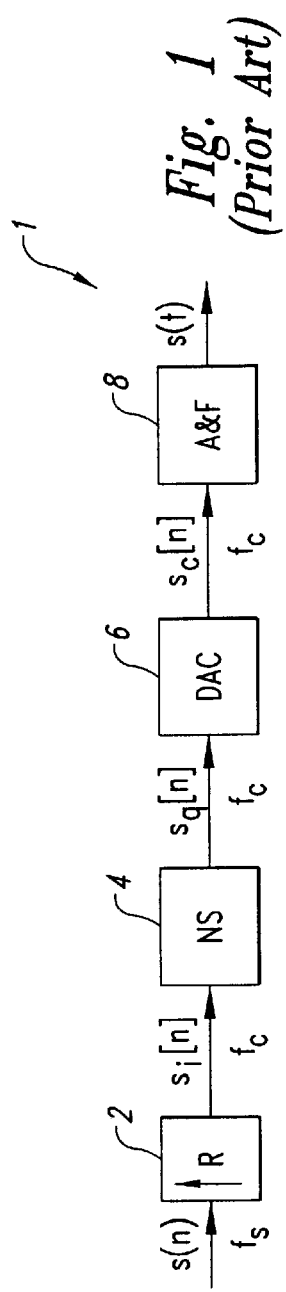
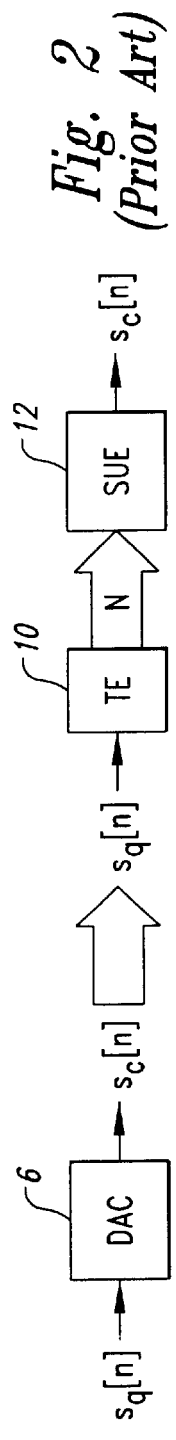
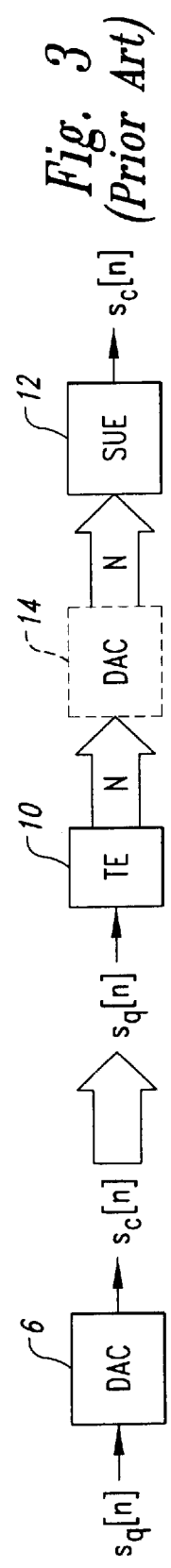
Fig. 1 (Prior Art)
Fig. 2 (Prior Art)
Fig. 3 (Prior Art)

METHOD FOR DYNAMIC MATCHING OF THE ELEMENTS OF AN INTEGRATED MULTIBIT DIGITAL-TO-ANALOG CONVERTER WITH BALANCED OUTPUT FOR AUDIO APPLICATIONS

BACKGROUND OF THE INVENTION

1. Field of the Invention

The present invention relates to a method for dynamic matching of the elements of an integrated multibit digital-to-analog converter with balanced output for audio applications.

2. Description of the Related Art

As is known, multibit digital-to-analog conversion for audio applications is performed by generating the output analog signal as the sum, at each sampling instant, of a given number of elementary quantities or contributions, which may be, for example, currents supplied by current generators or generated by means of resistors, or charges stored in capacitors.

It is also known that digital-to-analog conversion can be roughly divided into two major categories according to the approach adopted in the conversion. Belonging to the first category are those digital-to-analog conversions performed adopting an approach known in the literature as "thermometric coding", whereas belonging to the second category are those digital-to-analog conversions performed adopting an approach known in the literature as "binary coding".

In particular, in thermometric coding the elementary contributions used for generating the output analog signal assume values identical to one another and are generated by distinct generator elements numbering N, where N represents the number of levels of the output analog signal. In addition, in order to obtain a balanced output analog signal, i.e., an output signal of mean value zero able to assume either positive values or negative values that are symmetrical with respect to zero, one half of the generator elements supplies a positive elementary contribution and one half of the generator elements supplies a negative elementary contribution, and the value of each elementary contribution is $2A_{MAX}N$, where $A_{MAX}$ represents the maximum amplitude, either positive or negative, which it is desired that the output analog signal should assume.

In binary coding, instead, the number of distinct generator elements to be implemented for generating the elementary contributions is equal to n, where n represents the number of bits of the digital-to-analog converter and is equal to $n=\log_2 N$, and the dimensions of said generator elements are appropriately scaled in such a way that the elementary contributions generated thereby are submultiples of a power of 2 with respect to the maximum value $A_{MAX}$, in which the least significant bit (LSB) has a weight of $2A_{MAX}/N$, whilst the most significant bit (MSB) has a weight of $A_{MAX}$.

It may be readily appreciated how the element generating the MSB has a larger area than the element generating the LSB, and hence, in terms of area occupied, binary coding does not differ much from thermometric coding on account of the increase in the size of the generating elements due to the decrease in their number.

In addition, the heavy bearing that the errors on the most significant bits have in binary coding and the relatively high complexity of implementation, in said binary coding, of so-called "scrambling" techniques, i.e., ones through which the generator elements to be activated are appropriately chosen each time from the set of the ones available with the purpose of rendering the conversion error not correlated to the signal to be converted, have recently given a strong impulse to the development of thermometric coding.

At the highest level of abstraction, a digital-to-analog converter, hereinafter designated for reasons of convenience by the term "DAC", can be represented with the block diagram shown in FIG. 1, where s[n] designates the numerical sequence that is obtained from the sampling of the input audio signal, said sequence being then processed by the blocks downstream until the reconstruction s(t) of the signal is obtained at output from the power stage.

In particular, in FIG. 1 the part of numerical processing of the DAC, designated by 1, is formed by an interpolator 2 and a noise shaper 4, and has the purpose of reducing the number of bits with which the signal is encoded, without however worsening the quality thereof in terms of in-band noise level.

In detail, in order to maintain the high audio fidelity, the interpolator 2 performs an oversampling of the input signal s[n]; i.e., it increases the sampling frequency by a factor R, and this technique makes it possible to reduce the intensity in frequency of all spurious spectral components, at the same time eliminating undesired spectral repetitions.

The interpolation is followed by the noise-shaping operation performed by the noise shaper 4. The said operation consists in differentiating the signal transfer function and the requantization error transfer function: whilst the input signal is transferred from the input to the output unaltered, the requantization error "sees" a transfer typical of a high-pass filtering having a modulus smaller than one within the audio band and greater than one outside. The joint effect of these two operations is that of obtaining a decidedly high precision even in the presence of a quantizer with a very limited number of bits, even just one.

The numerical processing part is then followed by a block 6 which performs the actual analog-to-digital conversion and by an amplification and filtering block 8. The block 6 that performs the actual analog-to-digital conversion represents the interface between the two domains, the digital one and the analog one, and contained inside it are, as shown in FIG. 2, a thermometric encoder 10 and the set of the generator elements 12, which are known in the literature also as "unitary elements".

It is moreover known that, in the context of thermometric coding, it is not possible to integrate N generator elements that are perfectly identical to each other, and this entails the need to arrange an additional block downstream of the noise shaper, the said additional block having the purpose of offsetting the effects of the mismatch between the components, represented particularly by a non-linearity of the transfer characteristic and by the consequent distortion of the signal.

The complete block diagram of a DAC with mismatch compensation thus becomes the one shown in FIG. 3, in which the compensation block is designated by 14.

In the case, for instance, in which the generator elements are constituted by current generators formed by MOS transistors, the latter, although designed identical, have different dimensions and characteristics owing to the limited accuracy that characterizes any technological integration process; the causes can be diffusion imprecisions, irregularities in the masks used in the lithographic step, undesirable variations in the thicknesses of the oxide or metal layers, etc.

In addition, one of the technological processes most widely used for integration of current generators, known as Bipolar CMOS DMOS 5 (BCD5)—the most recent one among the processes able to integrate logic, linear and power circuits on the same chip—is not a technological process devised exclusively for the integration of MOS signal circuits (as may instead be the technological process known as HCMOS), and thus from said technological process very low tolerance values cannot be expected on the dimensions of the MOS transistors forming the current generators. The mismatches that take place are in fact reflected in a substantially proportional way on the values of the currents supplied by the generators on account of the linearity of the link between the drain current of a MOS transistor and its W/L shape ratio. The error that modifies the behavior of the output with respect to the desired one is strongly correlated to the signal, and consequently worsens the quality of the signal above all in terms of harmonic distortion.

Each of the generator elements supplies an elementary contribution different from the expected nominal contribution, and the error thus generated is transferred unaltered onto the output analog signal in so far as it is the sum of the various elementary contributions.

Given the extent of the latter (but for drifts in time) and assuming as predefined the set of generator elements activated for the synthesis of a given level K of the output analog signal, there will always be superimposed on the latter an error $\delta_K$ that is constant and equal to the sum of the errors introduced by the individual generator elements on account of the mismatches that characterize them.

The error $\delta_K$ is to be considered altogether independent of the errors $\delta_j$ (where $j \neq K$, $1 \leq j \leq N$) superimposed on the other levels of the output analog signal on account of the randomness of the mismatches present, and this entails a deformation of the transfer characteristic of the DAC (a typical staircase characteristic) which is not foreseeable a priori and hence cannot be eliminated in a simple way, for example by means of a block having an inverse characteristic, on account of the complexity characterizing said block.

In particular, the fact that the curve passing through the mean points of the levels of the transfer characteristic of the DAC is not a straight line is an index of the nonlinearity of the converter itself, and from this there derives a distortion of the signal which is all the greater the more marked is the diversity between the generator elements used for the generation of the elementary contributions that concur to form the output analog signal.

Since it is not possible to perform a "static" compensation of the nonideality of the generator elements of the DAC (on account of the excessive increase in production costs, laser trimming of the values of the individual integrated elements proves impracticable), in order to minimize the effects of the mismatches on the output signal, improving as far as possible the in-band spectrum, it has been proposed to resort to a "dynamic" compensation, which envisages modification, instant by instant, of the set of the generator elements that is used for generating the output analog signal, whatever the pattern of the input signal.

The philosophy lying at the basis of dynamic compensation of the nonideality of the generator elements may be readily understood if the errors due to the mismatches are assumed as being zero-average random ones, and if a constant input signal, for example equal to K, is considered: by always activating the same set of generator elements, at output a constant signal equal to $K+\delta_K$ will be obtained, whilst if a variation is made in the generator elements activated at each sampling instant, the output will follow an oscillating pattern with a mean value K. In this way, then, the error present on the output analog signal will no longer be constant but will vary in time ($\delta=\delta(t)$), and it will be possible to eliminate it by performing an average in time, which can be represented in the frequency domain by a low-pass filter.

The methodology described above is known in the literature as "Dynamic Element Matching" (DEM) and has different applications according to the modalities with which the generator elements to be activated are each time chosen.

Numerous DEM techniques have been proposed for compensating the nonlinearity of a DAC, the simplest being known in the literature as "Randomization" or "Scrambling". This envisages that the generator elements to be activated are chosen altogether at random among the ones available, thus determining a variable error even in the presence of a constant input.

The aforesaid methodology, however, has proved unable to lead to satisfactory results for audio applications, in so far as the random choice of the generator elements to be activated results in a considerable increase of in-band background noise, which entails a worsening of the signal to noise-and-distortion (SINAD) ratio, often unacceptable for this type of application.

In addition to the unacceptable increase in the amount of noise, a second aspect which renders the above methodology useful only at a theoretical level is the clear unrealizability of a block implementing it: at each sampling instant, a high number of random values must be generated simultaneously, and this is only possible with a logic of considerable dimensions, which is not integratable on a chip on which it is intended to implement also the filtering stage necessary for eliminating the aforesaid time-varying error ($\delta=\delta(t)$) presents on the output analog signal.

In order to overcome the drawbacks referred to above, numerous other DEM methodologies have been proposed that are able to eliminate the effects of the non-idealities of a DAC, the said methodologies being known in the literature as "Full/Partial Randomization", "Barrel Shifting", "Clocked Averaging", etc. A fair share of these, however, are not to be held satisfactory for an integrated audio design; acceptable performance can in fact be reached only at the expense of a considerable theoretical and implementational complexity.

Two methodologies which, instead, have appeared advantageous in the context of digital-to-analog power conversion are known in the literature as "Individual Level Averaging" (ILA) and "Data Weighted Averaging" (DWA).

The basic idea behind the above two methodologies is guaranteeing erasure of the error on the DAC output whatever the pattern of the input signal, and this may be possible if, for each level of the output signal, all the generator elements available are activated in turn. As the number of levels of the output signal increases, the time averaging operation that is necessary for eliminating undesired high-frequency fluctuations becomes more precise.

In particular, if for example an n-bit DAC for audio applications with an N-level balanced output is considered, i.e., a DAC able to supply at output an N-level analog signal with zero-averaging value, N/2 levels being positive and N/2 levels being negative, and the levels being symmetrical with respect to zero, the ILA methodology can be represented schematically as in FIGS. 4 and 5, which respectively regard the case where the input code X is positive and the case where the input code X is negative.

In particular, as illustrated in FIGS. 4 and 5, ILA envisages:

a) using N/2 positive generator elements (positive current generators) and N/2 negative generator elements (negative current generators) for the first audio channel (channel +) and as many positive and negative generator elements for the second channel (channel −); the said generator elements are represented in FIGS. 4 and 5 by squares designated with EU;

b) attributing to the positive generator elements and to the negative generator elements of each audio channel the same progressive addresses; this type of indexing is represented schematically in FIGS. 4 and 5 by organizing, for each audio channel, the positive generator elements in a first vector, designated by $V_1$, and the negative generator elements in a second vector, designated by $V_2$. In this way, the progressive addresses of the positive generator elements and of the negative generator elements are found to correspond to the positions of said generator elements within the respective vectors, and the addresses of the positive generator elements are found to be the same as those of the negative generator elements; and c) defining an index $I_X$ for each input code X supplied to the DAC, with $(-N/2+1) \leq X \leq N/2$.

Whenever an input code X appears on the input of the DAC, according to the sign of the input code X, for each of the two audio channels a set of X generator elements belonging to the vector $V_1$ or to the vector $V_2$ (indicated by hatched areas) is activated, in such a way as to obtain a first set of generator elements activated formed exclusively by positive generator elements, and a second set of generator elements activated formed exclusively by negative generator elements.

In particular, the same index $I_X$ is applied both to the vector $V_1$ (or $V_2$) of the first audio channel and to the vector $V_1$ (or $V_2$) of the second audio channel, and each set of generator elements activated is formed by the generator elements comprised between the one having index $I_X$ and the one having index $I_X+X-1$.

In particular, if the input code X is positive, then, as illustrated in FIG. 4, a first set of X positive generator elements belonging to the vector $V_1$ of the first channel and a second set of X negative generator elements belonging to the vector $V_2$ of the second channel are activated. The elementary contributions supplied by the X positive generator elements of the first set are added together, so giving rise to a positive output $Y_P$, and the elementary contributions supplied by the X negative generator elements of the second set are added together, so giving rise to a negative output $Y_N$.

If, instead, the input code X is negative, then, as illustrated in FIG. 5, a first set of X negative generator elements belonging to the vector $V_2$ of the first channel and a second set of X positive generator elements belonging to the vector $V_1$ of the second channel are activated. The elementary contributions supplied by the X negative generator elements of the first set are added together, so giving risen to a negative output $Y_N$, and the elementary contributions supplied by the X positive generator elements of the second set are added together, so giving rise to a positive output $Y_P$.

The positive output $Y_P$ and the negative output $Y_N$ are then respectively applied to the positive (+) terminal and to the negative (−) terminal of the load (loudspeaker), which is thus driven in a differential way.

Before the arrival of a new input code X at input to the DAC, the index $I_X$ is then updated in such a way as to identify a new set of generator elements to be used the next time that the input code X appears again at input to the DAC.

When an updating of the index $I_X$ causes the maximum value to be exceeded, the index $I_X$ is set equal to the difference between the value calculated exceeding the maximum value and the maximum value itself, so returning to the first generator elements of the vectors $V_1$ and $V_2$.

The same reasoning applies to the set of generator elements to be activated: if these go beyond the (N/2)-th generator element, the remaining generator elements are activated from the initial part of the vectors $V_1$ and $V_2$, and from this there derives that in ILA, as in all methodologies that are based upon an indexing of the generator elements, the vectors $V_1$ and $V_2$ are in fact circular vectors.

According to the procedure for updating the index $I_X$, ILA is distinguished into "Rotational Individual Level Averaging" (RILA) and "Additional Individual Level Averaging" (AILA).

The assessment of the efficacy of the above-mentioned two methodologies derives from the consideration that has led to the definition of ILA: within the said methodology, an algorithm is all the more satisfactory the shorter is the duration of its "erasure cycle", i.e., the time interval that must elapse for the index $I_X$ to return to its initial value. The practical justification for this statement is found in the case of a constant input: superimposed on the desired mean value there is present a random and periodic pattern, with a period equal to the time interval necessary for the index $I_X$ to return to its initial value, and as the duration of this period decreases the spectral components linked to the random oscillations will translate towards high frequencies, moving away from the base band.

In RILA, the law of updating of each index $I_X$ is as follows: $I_X(t+1)=I_X(t)+1$; this means activating at the sampling instant (t+1) a set of generator elements which differs by a single generator element with respect to the set of generator elements activated at the preceding sampling instant. Whatever the value of X, then, the erasure cycle always lasts N/2 sampling instants, equal to the time interval necessary for the index $I_X$ to return to the value 1.

In AILA, instead, the law of updating of each index $I_X$ is as follows: $I_X(t+1)=I_X(t)+|X|$; this means activating at the sampling instant (t+1) a set of generator elements completely separate from the set of generator elements extracted at the preceding sampling instant. It follows that when the input code X and N/2 have factors in common, the erasure cycle is shorter than that of RILA, and in particular when the input code X is a sub-multiple of N, the erasure cycle is reduced to (N/2)/X sampling instants, thus determining approach of the spectral components due to the mismatches to half the sampling frequency.

The implementation of a dynamic matching algorithm based on ILA is via a state logic which exploits the theory of state diagrams or trellis diagrams, the index of complexity of which (and consequently of the algorithm represented thereby), which is equal to the number of states characterizing the trellis diagram itself, is found to be equal to $(N-1)^{N-1}$ both for RILA and for AILA.

Such a high complexity inevitably leads to somewhat long erasure cycles, and hence to a far from effective modulation of the undesired spectral components present in the band, and this applies above all to RILA on account not only of the longer time interval required by the algorithm for activation of all the generator elements, but also on account of the fact that the indices are updated with a constant quantity.

To reduce the circuit complexity of the logic implementing the dynamic matching algorithm, the aforementioned Data Weighted Averaging (DWA) methodology has been then proposed, the aim of which is to cause all the generator elements of the DAC to be activated in the shortest time possible, at the same time ensuring that each of them is activated the same number of times, even in short time intervals.

In particular, DWA is a simplification of AILA obtained by drastically reducing the "degrees of freedom" defined by the high number of indices used (one for each input code X supplied to the DAC input). In particular, in DWA only one index is used, which is each time modified by the input code X, and this methodology envisages selecting, at each sampling instant, |X| consecutive generator elements starting from the first element not used at the preceding sampling instant. Consequently, in this methodology only one index is required, which is each time updated according to the relation I(t+1)=I(t)+|X|, which is very similar to the relation of AILA, but no longer contains a distinction between the indices according to the input code X.

Erasure of the error is controlled exclusively by the pattern of the input code X, whence the name of the methodology. With a single index, moreover, the circuit complexity of the logic implementing this methodology, evaluated according to the same criteria as those used for evaluating the complexity of the RILA and AILA methodologies, proves to be equal to $(N-1)^2$, i.e., decidedly lower than that of ILA.

Although DWA presents a circuit complexity decidedly lower than those of RILA and AILA and a decidedly good performance in terms of SINAD ratio both in the presence of positive input signals (i.e., encoded with levels of between 0 and N−1) and in the presence of zero-averaging input signals (i e., characterized by a high number of zero crossings) having a sufficiently high amplitude (greater than −30 dB), it, however, affords a performance that becomes noticeably poorer as the amplitude of the zero-average signals decreases. Consequently, its use does not make it possible to render the non-linearities of the two branches, the positive one and the negative one, of the transfer characteristic uncorrelated as the amplitude of the input signal varies, and hence does not make it possible to achieve a SINAD ratio acceptable for audio applications.

BRIEF SUMMARY OF THE INVENTION

The disclosed embodiments of the present invention provide a digital-to-analog conversion method that enables the drawbacks described above to be overcome at least in part, and in particular that provides a good behavior of the digital-to-analog converter even in the presence of zero-average signals characterized by frequent zero crossings and reduced amplitudes, this being a fundamental constraint for audio devices with differential output, and hence zero-averaging value.

In accordance with one embodiment of the invention, a method for digital-to-analog conversion of a digital input code into a first and a second output analog signal to be supplied to a first terminal and a second terminal of a load, the conversion being performed by a digital-to-analog converter with an N-level balanced output is provided. The method includes providing N/2 positive generator elements that supply respective positive elementary contributions that are nominally equal to one another, and N/2 negative generator elements supplying respective negative elementary contributions that are nominally equal to one another and, in absolute value, equal to the positive elementary contributions; attributing the same progressive addresses to the positive generator elements and to the negative generator elements; defining a first index for positive input codes and a second index for negative input codes; and, in response to an input code at the input of the digital-to-analog converter: selecting, between the first and second index, the index corresponding to a sign of the input code; activating a first set of positive generator elements and a second set of negative generator elements, the number of negative and positive generator elements activated being equal to one another and a function of the input code, the addresses of the negative and positive generator elements activated being a function of the selected index; generating the first output analog signal as a function of the positive elementary contributions and generating the second output analog signal as a function of the negative elementary contributions; and updating the selected index according to the input code.

BRIEF DESCRIPTION OF THE SEVERAL VIEWS OF THE DRAWINGS

For a better understanding of the present invention, a preferred embodiment thereof is now described, purely to provide a non-limiting example, with reference to the attached drawings, in which:

FIG. 1 shows a block diagram of a digital-to-analog converter represented at the highest level of abstraction;

FIG. 2 shows a first block diagram of a block of FIG. 1 which performs digital-to-analog conversion;

FIG. 3 shows a second block diagram of the block of FIG. 1 which performs digital-to-analog conversion;

DETAILED DESCRIPTION OF THE INVENTION

The embodiments of the present invention relate to a new methodology of digital-to-analog conversion devised for digital-to-analog conversion systems with symmetrical characteristic (i.e., systems receiving zero-average input signals characterized by frequent zero crossings) and includes the use of a number of generator elements equal to one half of those used in the methodologies according to the prior art, the use of two indices, one for the positive input codes and one for the negative input codes, and the application of the Data Weighted Averaging (DWA) methodology separately to both the branches of the characteristic of the DAC. For this reason, then, the methodology according to the embodiments of the present invention has been given the name of Differential Data Weighted Averaging (DDWA).

Figure 6:
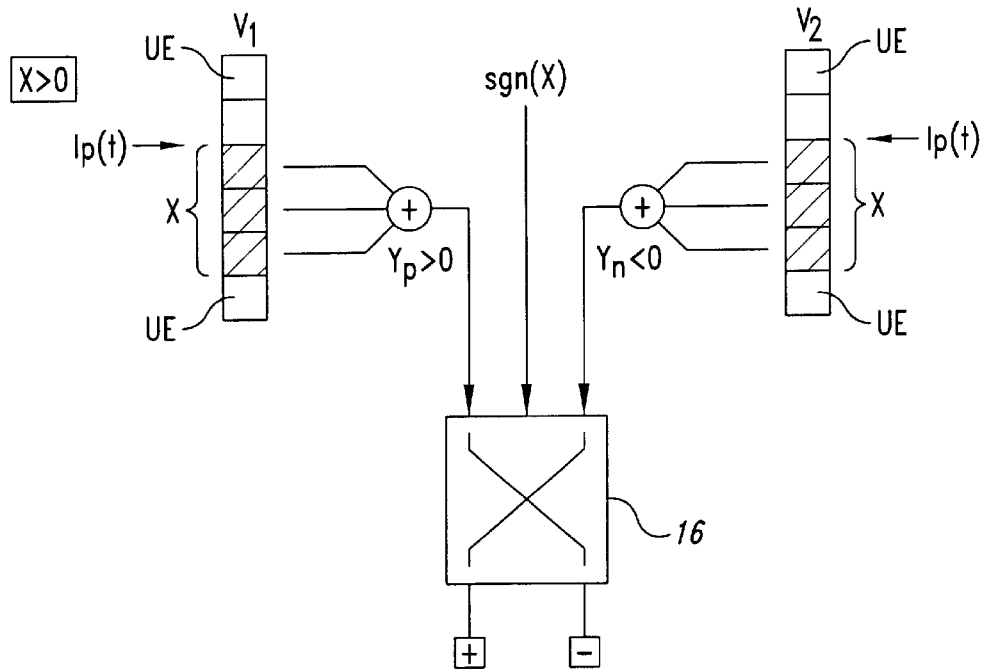
FIGS. 6 and 7 are schematic representations of the methodology referred to as "Differential Data Weighted Averaging" according to the present invention.
Figure 7:
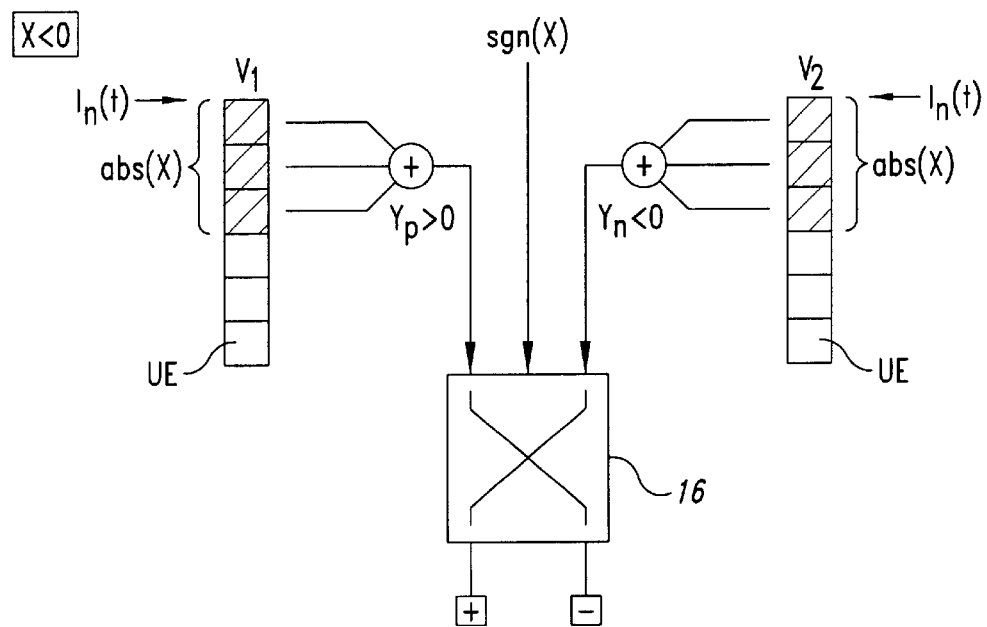

In particular, the DDWA methodology according to the embodiments of the present invention can be schematically represented as in FIGS. 6 and 7, which are directed to the case in which the input code X is positive and the case in which the input code X is negative.

Figure 4:
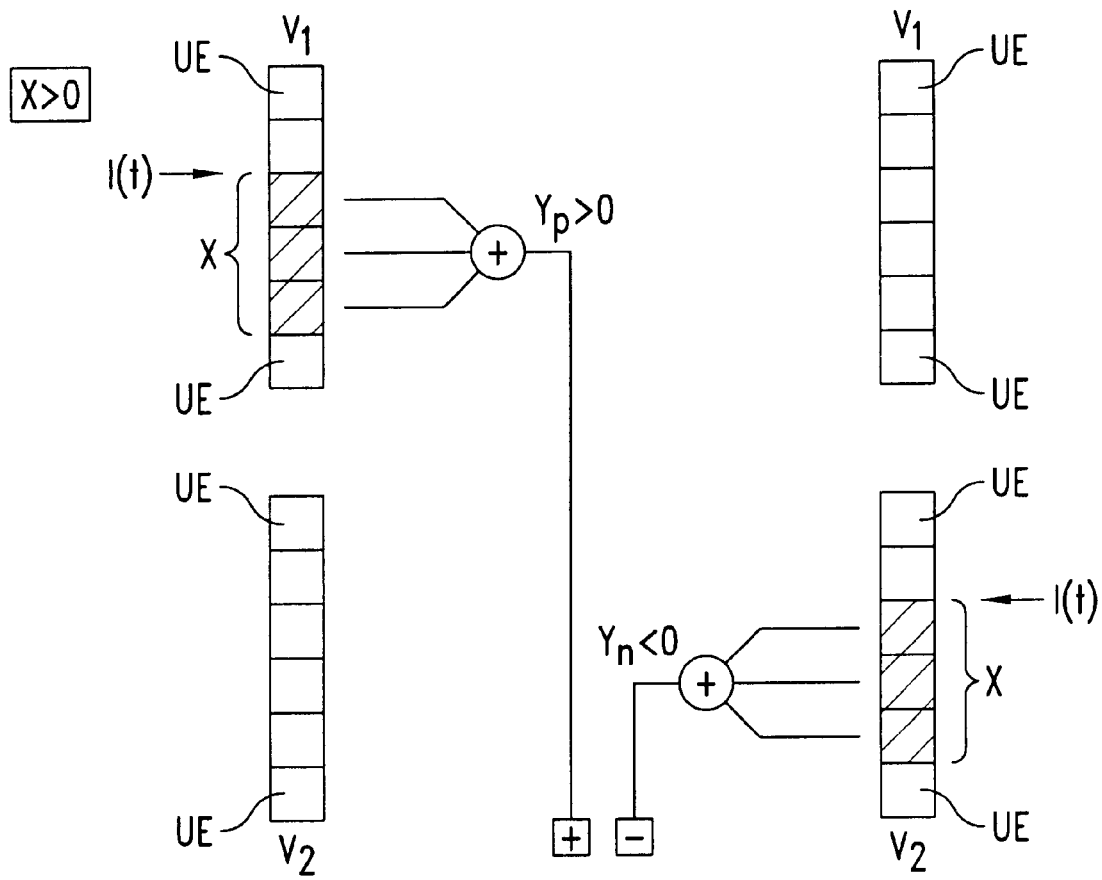
FIGS. 4 and 5 are schematic representations of the methodology referred to as "Individual Level Averaging" according to the prior art.
Figure 5:
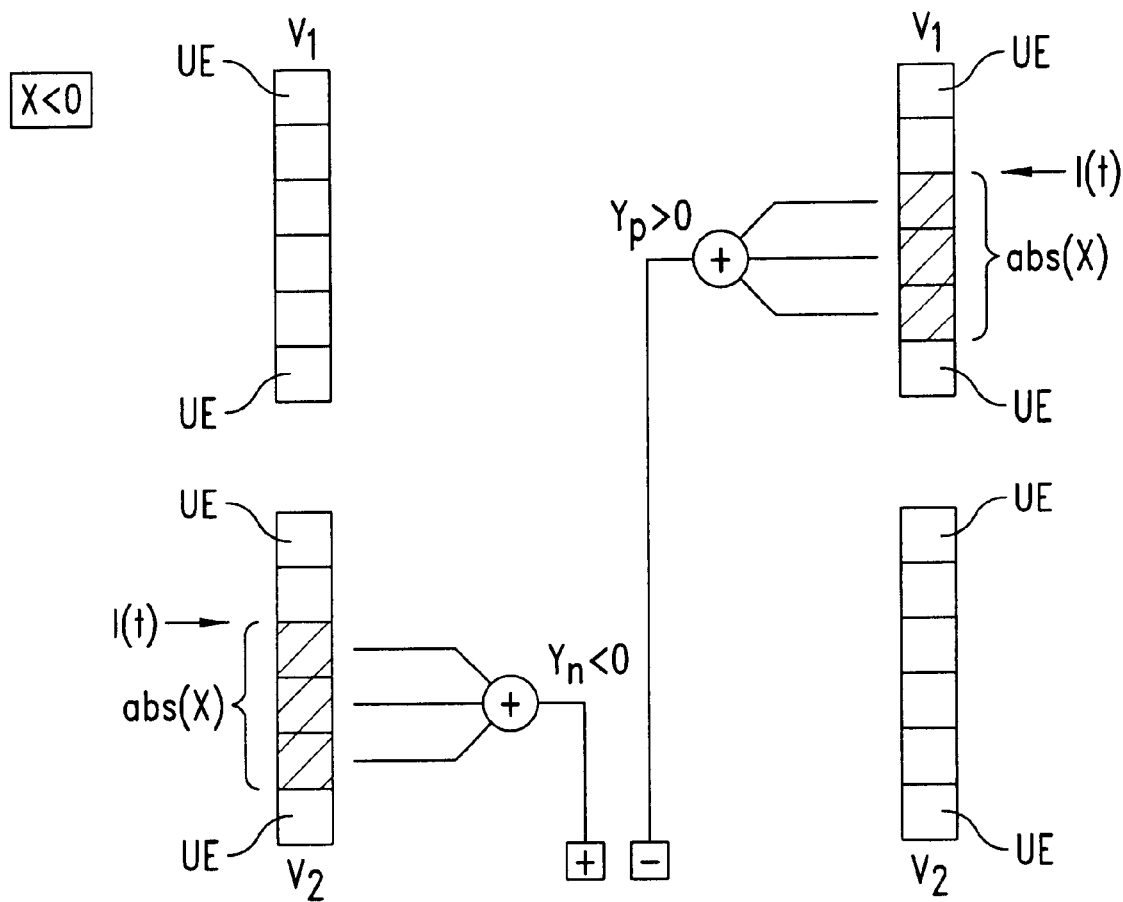

In particular, considering again an n-bit DAC for audio applications, i.e. a DAC with an N-level balanced output, N/2 levels being positive and N/2 levels being negative, DDWA basically includes:

a) using a number of generator elements equal to one half of those used in DWA, namely, N/2 positive generator elements for the first audio channel (channel +) and N/2 negative generator elements for the second audio channel (channel −);

b) attributing to the positive generator elements and to the negative generator elements the same progressive addresses; this type of indexing is represented schematically in FIGS. 6 and 7 in a way similar to what was represented in FIGS. 4 and 5, i.e., by organizing the positive generator elements in a first vector, designated by $V_1$, and the negative generator elements in a second vector, designated by $V_2$: in this way, the progressive addresses of the positive generator elements and of the negative generator elements are found to correspond to the positions of said generator elements within the respective vectors, and the addresses of the positive generator elements are found to be the same as those of the negative generator elements; and c) defining a first index $I_P$ for positive input codes X, with $0<X \leq N/2$, and a second index $I_N$ for negative input codes, with $(-N/2+1) \leq X<0$.

Whenever an input code X, whether positive or negative, appears on the DAC input, a first set of X positive generator elements belonging to the vector $V_1$ and a second set of X negative generator elements belonging to the vector $V_2$ are activated.

When the input code X is positive, each of the two sets of generator elements activated is formed by the generator elements comprised between the one having index $I_P$ and the one having index $I_P+X-1$. When the input code X is negative, each of the two sets of generator elements activated is formed by the generator elements comprised between the one having index $I_N$ and the one having index $I_N+X-1$.

The positive elementary contributions supplied by the X positive generator elements activated are then added together, thus giving rise to a positive output $Y_P$, and likewise the negative elementary contributions supplied by the X negative generator elements activated are added together, thus giving rise to a negative output $Y_N$.

The positive output $Y_P$ and the negative output $Y_N$ are then supplied to a first input and to a second input of a double changeover switch, designated by 16, which moreover has a third input to which the sign of the input code X, designated by sgn(X), is supplied, and a first output and a second output respectively connected to the positive terminal (+) and to the negative terminal (−) of the load (loudspeaker), which is thus driven in a differential way.

In particular, the sign of the input code X is used for selectively controlling connection of the first output and of the second output to the first input and to the second input in the way described in what follows. If the sign of the input code X is positive, the first output is connected to the first input and the second output is connected to the second input; consequently, to the first audio channel (+) is applied the sum $Y_P$ of the positive elementary contributions supplied by the X positive generator elements activated, and to the second audio channel (−) is applied the sum $Y_N$ of the negative elementary contributions supplied by the X negative generator elements activated. If, instead, the sign of the input code X is negative, the first output is connected to the second input and the second output is connected to the first input; consequently, to the first audio channel (+) is applied the sum $Y_N$ of the negative elementary contributions, and to the second audio channel (−) is applied the sum $Y_P$ of the positive elementary contributions.

Updating of the indices is performed in a way similar to what was described previously for DWA, the updating each time being applied to the index selected by the input code X; namely, $I_P(t+1)=I_P(t)+|X|$ and $I_N(t+1)=I_N(t)+|X|$.

Figure 8:
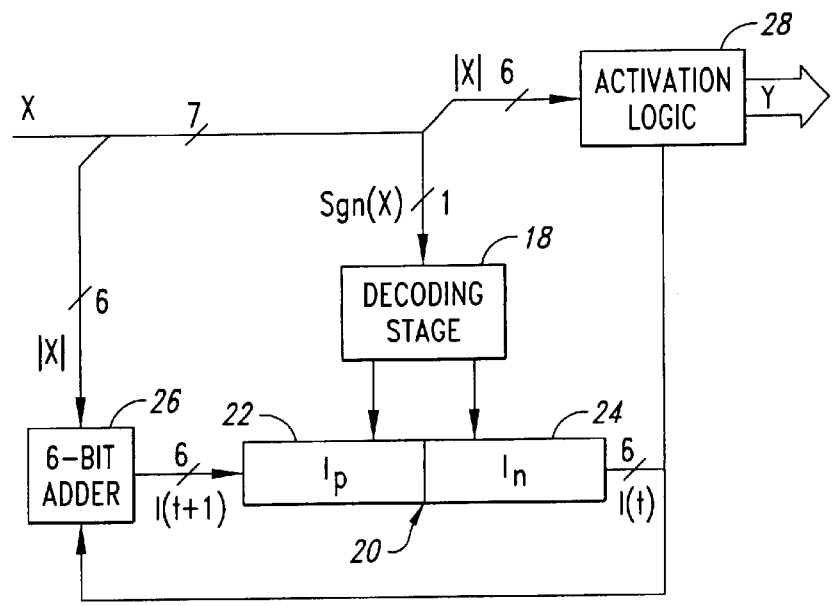
FIG. 8 shows the logic necessary for implementation of "Differential Data Weighted Averaging"

FIG. 8 shows the logic required for implementing DDWA for a 6-bit (plus one sign bit) DAC, in which the sign sgn(X) of the input code X is used by a decoding stage 18, represented simply by a NOT logic gate, for selecting and reading the positive index $I_P(t)$ or the negative index $I_N(t)$ stored in a storage stage 20, formed by two 6-bit memory cells 22, 24. Updating of the index $I_P(t)$ or $I_N(t)$ used is performed by means of a 6-bit adder 26 receiving at input the absolute value of the input code X and the positive index $I_P(t)$ or the negative index $I_N(t)$ used, and selection and activation of the X generator elements to be used for generating the output analog value is performed by means of an activation logic 28 receiving at input the absolute value of the input code X and the positive index $I_P(t)$ or the negative index $I_N(t)$ read from the memory cell.

DDWA makes it possible to combine the positive aspects of AILA and of DWA. In fact, the methodology according to this embodiment of the present invention has the capacity of erasing the error of the pattern of the input signal, provided that it is possible to have a sufficiently long waiting time, this being a characteristic of AILA, and at the same time guaranteeing the intrinsic speed of use of all the generator elements, this being a characteristic of DWA.

From simulations performed by the present applicant, if a reconstructed signal occupying one half of the output dynamics of the DAC is considered, an evident improvement has emerged in the performance, in terms of audio quality, that DDWA method of the present invention enables to be obtained as compared to DWA. In particular, in addition to eliminating the harmonic components of the signal due to the nonlinearity of the transfer characteristic, DDWA significantly reduces, by means of an appropriate modulation, the level of in-band noise, thus giving rise to SINAD and dynamic-range (DR) values at least 20 dB higher than those afforded by any other methodology in the conditions considered.

The simulations performed by the applicant have moreover shown how the improvement is even more evident if, instead of considering a signal occupying one half of the dynamics, signals of a decidedly lower amplitude that are characterized by numerous zero crossings are considered.

Further advantages afforded by DDWA are represented by the simplicity of the logic necessary for implementing the algorithm and by the fact that the number of generator elements (current generators) is, for differential-output systems, reduced by a factor of 2 as compared to the number required for implementing DWA.

These advantages are, however, obtained at the expense of a slightly greater circuit complexity of the logic of activation of the generator elements as compared to that of DWA, in so far as two indices are used instead of a single one; in addition, as compared to the latter methodology, it is necessary to provide the double changeover switch and to introduce the decoding stage, which, however, is constituted by a simple NOT gate.

The area occupied on the silicon is in any case very limited and decidedly less than that required for implementing all the other methodologies referred to above.

It is moreover emphasized that the DDWA is undoubtedly the simplest methodology from the standpoint of implementation as compared to all the other methodologies analyzed, except for DWA alone, which, however, presents a considerably poorer performance for zero-average signals.

It is further emphasized that in DDWA the elementary contributions extracted from the vectors $V_1$ and $V_2$ have the same positions within the two vectors, identified by the index $I_P(t)$ or $I_N(t)$ according to the sign of the input code X; consequently, simultaneous activation of generator elements in coinciding positions enables, in the phase of design of the analog part, "joining" at the circuit level the positive generator elements to the corresponding negative generator elements, in such a way as to obtain a single block of N/2 generator elements, which are slightly more complex and are provided with a "bidirectional" output, i.e., generator elements able to supply at output both a positive elementary contribution and a negative elementary contribution.

Figure 9:
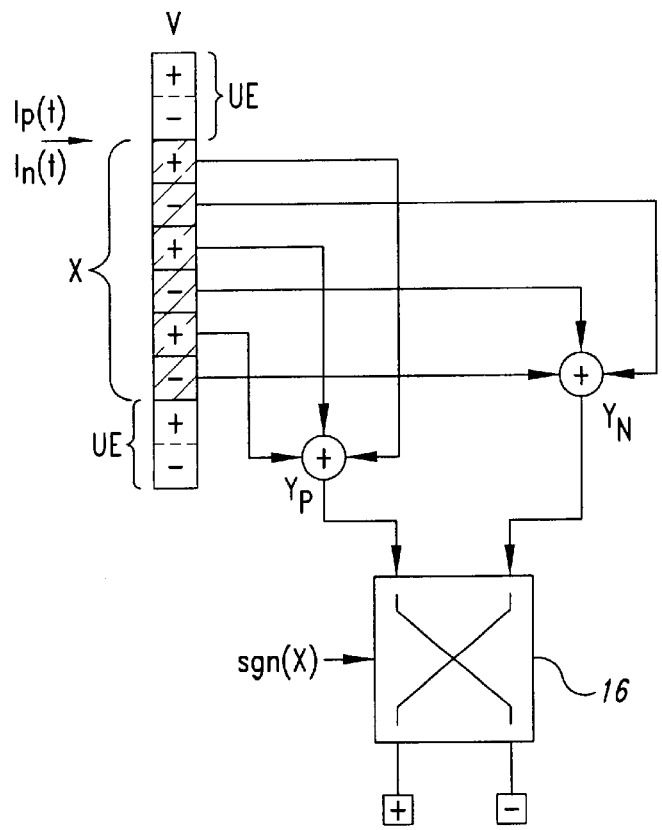
FIG. 9 shows a different schematic representation of the methodology referred to as "Differential Data Weighted Averaging" according to the present invention.

FIG. 9 is a schematic representation, similar to the representation of FIG. 6, of the DDWA methodology according to the embodiments of the present invention, where V designates the vector of the N/2 "bidirectional" generator elements, and "+" and "−" respectively designate the positive output and the negative output of each of them.

According then to the sign of the input code X, X generator elements are selected starting from the one having index $I_P$ if the signal of the input code X is positive, or starting from the one having index $I_N$ if the signal of the input code X is negative, and the sum of the positive outputs and the sum of the negative outputs of said generator elements are then sent to the load via the double changeover switch 16 described previously.

FIGS. 10, 11, 12, and 13 show the circuit structures with which it is possible to implement, respectively, the positive generator elements, the negative generator elements, the bidirectional generator elements, and the double changeover switch.

Figure 10:
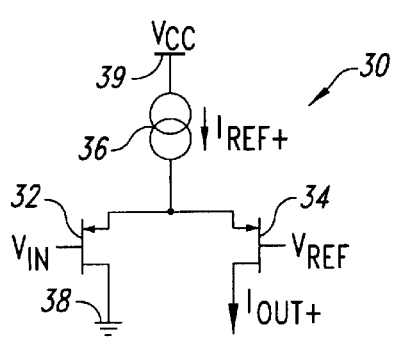
FIG. 10 shows the circuit structure of a positive generator element.

In particular, FIG. 10 shows a positive generator element, designated as a whole by 30, operating as a current generator supplying an output current $I_{OUT+}$. The positive generator element 30 is basically formed by a pair of PMOS transistors 32, 34 connected together in differential configuration, and by a current generator 36 connected to a supply line 39 set at a supply voltage $V_{cc}$ and supplying a reference current $I_{REF+}$. In particular, the PMOS transistors 32, 34 have source terminals connected together and to the current generator 36, from which they receive the reference current $I_{REF+}$. In addition, the PMOS transistor 32 has a gate terminal receiving an activation voltage $V_{IN}$ and a drain terminal connected to a ground line 38 set at a ground voltage, whilst the second PMOS transistor 34 has a gate terminal receiving a reference voltage $V_{REF}$ and a drain terminal defining the output of the positive generator element 30 and supplying the aforesaid output current $I_{OUT+}$.

Operation of the positive generator element is as follows: when the activation voltage $V_{IN}$ is higher than the reference voltage $V_{REF}$, then the PMOS transistor 32 is off and the PMOS transistor 34 is on, and hence the output current $I_{OUT+}$ is equal to the reference current $I_{REF+}$, whereas when the activation voltage $V_{IN}$ is lower than the reference voltage $V_{REF}$, then the PMOS transistor 32 is on and the PMOS transistor 34 is off, and hence the output current $I_{OUT+}$ is zero in so far as the reference current $I_{REF+}$ is transferred to the ground line 38.

Figure 11:
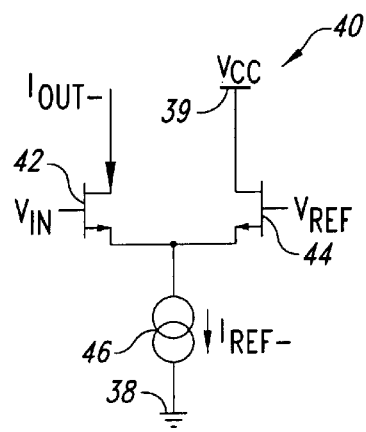
FIG. 11 shows the circuit structure of a negative generator element.

FIG. 11 shows the circuit structure of a negative generator element, designated as a whole by 40, operating as a current generator drawing an output current $I_{OUT-}$. The negative generator element 40 has a circuit structure similar to that of the positive generator element 30 and is basically formed by a pair of NMOS transistors 42, 44 connected in differential configuration, and by a current generator 46 connected to the ground line 38 and drawing a reference current $I_{REF-}$. The NMOS transistors 42, 44 have source terminals connected together and to the current generator 46, which draws from the said terminals the reference current $I_{REF-}$. In addition, the NMOS transistor 42 has a gate terminal receiving an activation voltage $V_{IN}$ and a drain terminal defining the output of the negative generator element 40 and drawing the aforesaid output current $I_{OUT-}$, whilst the NMOS transistor 44 has a gate terminal receiving a reference voltage $V_{REF}$ and a drain terminal connected to the supply line 39.

Operation of the negative generator element is as follows: when the activation voltage $V_{IN}$ is higher than the reference voltage $V_{REF}$, then the NMOS transistor 42 is on and the NMOS transistor 44 is off, and hence the output current $I_{OUT-}$ is equal to the reference current $I_{REF-}$, whereas when the activation voltage $V_{IN}$ is lower than the reference voltage $V_{REF}$, then the NMOS transistor 42 is off and the NMOS transistor 44 is on, and hence the output current $I_{OUT-}$ is zero in so far as the reference current $I_{REF-}$ is drawn by the supply line 39.

Figure 12:
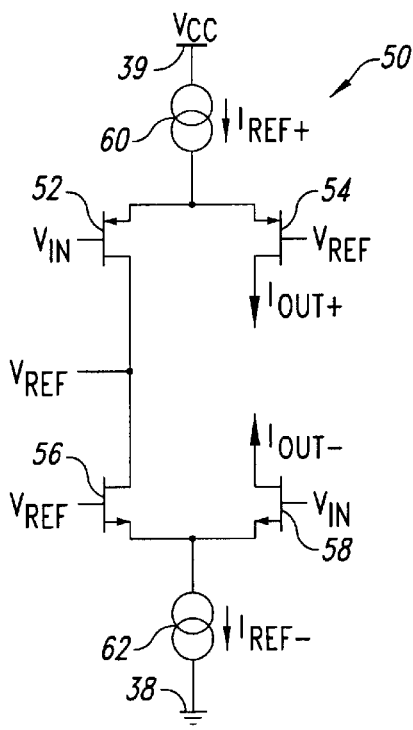
FIG. 12 shows the circuit structure of a bidirectional generator element.

FIG. 12 shows the circuit structure of a bidirectional generator element, designated as a whole by 50, operating as a bidirectional current generator, i.e., being able to supply an output current $I_{OUT+}$ and to draw an output current $I_{OUT-}$. The bidirectional generator element 50 presents a circuit structure very similar to the one that would result from parallel connection of the circuit structures of the positive and negative generator elements 30, 40, and in particular comprises a pair of PMOS transistors 52, 54 connected together in differential configuration, a pair of NMOS transistors 56, 58 connected together in differential configuration, and a pair of current generators 60, 62 respectively connected to the supply line 39 and to the ground line 38, the former current generator supplying a reference current $I_{REF+}$ and the latter current generator drawing a reference current $I_{REF-}$.

In detail, the PMOS transistors 52, 54 have source terminals connected together and to the current generator 60, from which they receive the reference current $I_{REF+}$. In addition, the PMOS transistor 52 has a gate terminal receiving the activation voltage $V_{IN}$ and a drain terminal biased at the reference voltage $V_{REF}$, whilst the PMOS transistor 54 has a gate terminal receiving the reference voltage $V_{REF}$ and a drain terminal defining the positive output of the bidirectional generator element 50 and supplying the aforesaid output current $I_{OUT+}$.

The NMOS transistors 56, 58, instead, have source terminals connected together and to the current generator 62, which draws from the said terminals the reference current $I_{REF-}$. In addition, the NMOS transistor 56 has a gate terminal receiving the reference voltage $V_{REF}$ and a drain terminal biased at the reference voltage $V_{REF}$, whilst the NMOS transistor 58 has a gate terminal receiving the activation voltage $V_{IN}$ and a drain terminal defining the negative output of the bidirectional generator element 60 and drawing the aforesaid output current $I_{OUT-}$.

Operation of the bidirectional generator element 50 is as follows: when the activation voltage $V_{IN}$ is higher than the reference voltage $V_{REF}$, then the PMOS transistor 54 and the NMOS transistor 58 are on, whilst the PMOS transistor 52 and the NMOS transistor 56 are off, and hence the output current $I_{OUT+}$ is equal to the reference current $I_{REF+}$, and the output current $I_{OUT-}$ is equal to the reference current $I_{REF-}$, whereas when the activation voltage $V_{IN}$ is lower than the reference voltage $V_{REF}$, then the PMOS transistor 54 and the NMOS transistor 58 are off, whilst the PMOS transistor 52 and the NMOS transistor 56 are on, and consequently both the output current $I_{OUT+}$ and the output current $I_{OUT-}$ are zero.

Figure 13:
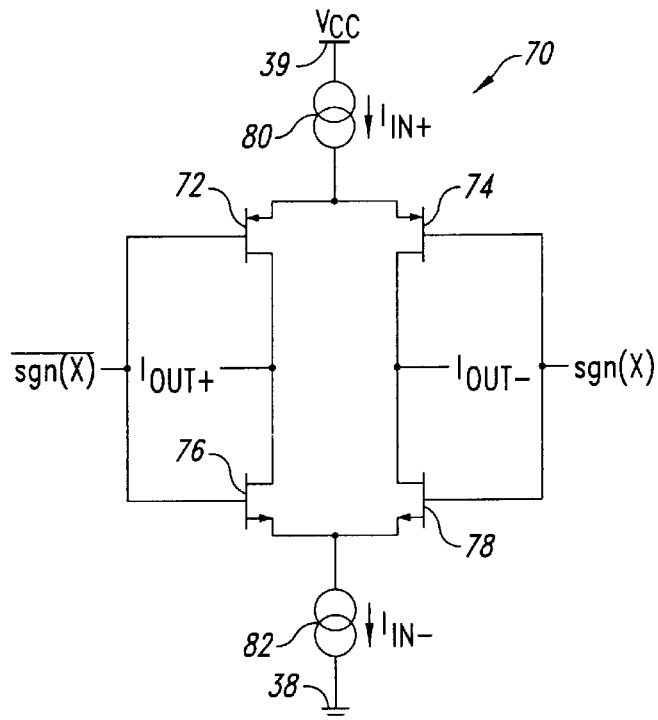
FIG. 13 shows the circuit structure of a double changeover switch.

Finally, FIG. 13 shows the circuit structure of a double changeover switch used in the implementation of the methodology according to the present invention.

In particular, the double changeover switch, designated by 70, comprises a pair of PMOS transistors 72, 74 and a pair of NMOS transistors 76, 78 connected in double differential configuration.

In detail, the PMOS transistors 72, 74 have their source terminals connected together and receiving an input current $I_{IN+}$, represented schematically in the figure by a current generator 80, consisting of the sum $Y_P$ of the positive elementary contributions extracted from the vector $V_1$ (FIGS. 6 and 7), gate terminals receiving the negated sign of the input code X, designated by $\overline{sgn(X)}$ and, respectively, the sign of the input code X, designated by sgn(X), and drain terminals respectively connected to the drain terminal of the NMOS transistor 76 and to the drain terminal of the NMOS transistor 78, which in turn have gate terminals also receiving the negated sign $\overline{sgn(X)}$ of the input code X and, respectively, the sign sgn(X) of the input code X, and source terminals which are connected together and from which an input current $I_{IN-}$ is drawn, represented schematically in the figure by a current generator 82, consisting of the sum $Y_N$ of the negative elementary contributions extracted from the vector $V_2$ (FIGS. 6 and 7).

The drain terminals of the PMOS transistor 72 and of the NMOS transistor 76 define the first output of the double changeover switch 70 supplying an output current $I_{OUT+}$, whilst the drain terminals of the PMOS transistor 74 and of the NMOS transistor 78 define the second output of the double changeover switch 70 supplying an output current $I_{OUT-}$.

Operation of the double changeover switch 70 is as follows: when sgn(X) assumes a high logic level and $\overline{sgn(X)}$ assumes a low logic level, then the PMOS transistor 72 and the NMOS transistor 78 are on, and the PMOS transistor 74 and the NMOS transistor 76 are off, and hence the output current $I_{OUT+}$ is equal to the input current $I_{IN+}$ and the output current $I_{OUT-}$ is equal to the input current $I_{IN-}$, whereas when sgn(X) assumes a low logic level and $\overline{sgn(X)}$ assumes a high logic level, then the PMOS transistor 72 and the NMOS transistor 78 are off, and the PMOS transistor 74 and the NMOS transistor 76 are on, and hence the output current $I_{OUT+}$ is equal to the input current $I_{IN-}$ and the output current $I_{OUT-}$ is equal to the input current $I_{IN+}$.

Finally, it is evident that modifications and variations may be made to the matching method described and illustrated herein without thereby departing from the sphere of protection of the present invention as defined by the attached claims.

For example, the addresses of the positive generator elements activated could even not be the same as those of the negative generator elements activated, even though the number of positive generator elements activated and the number of negative generator elements activated must necessarily remain equal to one another. In this case, however, it is no longer possible to "join" at a circuit level the N/2 positive generator elements to the N/2 corresponding negative generator elements to form the N/2 bidirectional generator elements.

In addition, the number of positive generator elements activated and the number of negative generator elements activated could not be equal to the input code X, but more generally be a linear function of said code, and in particular be proportional to said code.

From the foregoing it will be appreciated that, although specific embodiments of the invention have been described herein for purposes of illustration, various modifications may be made without deviating from the spirit and scope of the invention. Accordingly, the invention is not limited except as by the appended claims, and the equivalents thereof.

What is claimed is:

1. A method for digital-to-analog conversion of a digital input code into a first output analog signal and a second output analog signal to be supplied to a first terminal and a second terminal of a load, in particular an audio load, said conversion being performed by means of a digital-to-analog converter with an N-level balanced output, said method comprising the steps of:

providing N/2 positive generator elements supplying respective positive elementary contributions that are nominally equal to one another, and N/2 negative generator elements supplying respective negative elementary contributions that are nominally equal to one another and, in absolute value, equal to the positive elementary contributions;

attributing the same progressive addresses to said positive generator elements and to said negative generator elements;

defining a first index for positive input codes and a second index for negative input codes; and in the presence of an input code at the input of said digital-to-analog converter:

selecting, between said first index and said second index, the index corresponding to the sign of said input code;

activating a first set of positive generator elements and a second set of negative generator elements, the number of the positive generator elements activated and the number of the negative generator elements activated being equal to one another and a function of said input code, and the addresses of the positive generator elements activated and of the negative generator elements activated being a function of said selected index ($I_P$, $I_N$);

generating said first output analog signal as a function of the positive elementary contributions supplied by the positive generator elements activated, and said second output analog signal as a function of the negative elementary contributions supplied by the negative generator elements activated; and updating said selected index according to said input code.

2. The digital-to-analog conversion method of claim 1 wherein the number of the positive generator elements activated and the number of the negative generator elements activated are a linear function of said input code.

3. The digital-to-analog conversion method of claim 1 wherein the number of the positive generator elements activated and the number of the negative generator elements activated are proportional to said input code.

4. The digital-to-analog conversion method of claim 1 wherein the number of the positive generator elements activated and the number of the negative generator elements activated are equal to said input code.

5. The digital-to-analog conversion method of claim 1 wherein the positive generator elements activated have the same addresses as the negative generator elements activated.

6. The digital-to-analog conversion method of claim 1 wherein the positive generator elements activated have consecutive addresses.

7. The digital-to-analog conversion method of claim 1 wherein the negative generator elements activated have consecutive addresses.

8. The digital-to-analog conversion method of claim 1 wherein each of said first set and second set of generator elements is formed by generator elements comprised between the one having an address equal to said selected index and the one having an address equal to said selected index increased by the absolute value of said input code and decreased by 1.

9. The digital-to-analog conversion method of claim 1 wherein said positive generator elements and said negative generator elements are implemented by means of respective current generators, the currents of which define said elementary contributions.

10. The digital-to-analog conversion method of claim 1, further comprising the step of:
supplying said first output signal and said second output signal to said first terminal and said second terminal of said load according to the sign of said input code.

11. The digital-to-analog conversion method of claim 10 wherein supplying said first output signal and said second output signal to said first terminal and said second terminal of said load according to the sign of said input code comprises the steps of:
when the sign of the input code is positive, applying said first output signal to said first terminal of said load, and said second output signal to said second terminal of said load; and
when the sign of the input code is negative, applying said first output signal to said second terminal of said load, and said second output signal to said first terminal of said load.

12. The digital-to-analog conversion method of claim 1 wherein said positive generator elements and said negative generator elements are distinct from one another, and each of them comprises a pair of transistors connected together in differential configuration and a current generator, said pair of transistors having first terminals connected together and to the current generator, and control terminals respectively receiving an activation signal and a reference signal, a second terminal of one of said transistors defining the output of the generator element.

13. The digital-to-analog conversion method of claim 1, comprising providing a bidirectional generator element formed of said positive generator elements and a corresponding negative generator element and having a first output supplying an output current and a second output drawing an output current, said bidirectional generator element comprising a first pair of transistors and a second pair of transistors connected together in differential configuration, and a first current generator and a second current generator, the transistors of said first pair of transistors having first terminals connected together and to said first current generator, and control terminals respectively receiving an activation signal and a reference signal, a second terminal of one of said transistors of said first pair of transistors defining said first output of the bidirectional generator, and the transistors of said second pair of transistors having first terminals connected together and to said second current generator, and control terminals respectively receiving said reference signal and said activation signal, a second terminal of one of said transistors of said second pair of transistors defining said second output of the bidirectional generator.

14. The digital-to-analog conversion method of claim 10 wherein supplying said first output signal and said second output signal to said first terminal and said second terminal of said load according to the sign of said input code comprises providing a changeover switch device having a first input and a second input respectively receiving said first output signal and said second output signal, a control input receiving a control signal indicating the sign of said input code, and a first output and a second output selectively connectable to said first input and said second input according to the sign of the input code, said changeover switch device comprising a first pair of transistors and a second pair of transistors connected together in differential configuration, and a first current generator and a second current generator, the transistors of said first pair of transistors having first terminals connected together and to said first current generator, and control terminals respectively receiving said control signal and a negated control signal ($\overline{\text{sgn}(X)}$), second terminals connected to respective second terminals of the transistors of said second pair of transistors and respectively defining said first output and said second output of said changeover switch device, the transistors of said second pair further comprising first terminals connected together and to said second current generator, and control terminals respectively receiving said control signal and said negated control signal ($\overline{\text{sgn}(X)}$).

15. A method for digital-to-analog conversion of a digital input code into first and second analog output signals to be supplied to a first and second terminal of a load, respectively, the method performed by a digital-to-analog converter with an N-level balanced output, the converter including N/2 positive and negative generator elements configured to supply positive and negative currents, the positive currents nominally equal to one another and the negative currents nominally equal to one another, and, in absolute value, the positive and negative currents equal to each other, the digital-to-analog converter having the same progressive addresses attributed to the positive and negative generator elements and further defining a first index for positive input codes and a second index for negative input codes; the method comprising:
receiving an input code at the input of the digital-to-analog converter;
selecting between the first index and the second index, the index selected corresponding to the sign of the input code;
in response to the input code, activating a first set of the positive generator elements and a second set of the negative generator elements, the number of negative and positive generator elements activated being equal to one another, the addresses of the positive and negative generator elements determined as a function of the selected index;
generating the first output analog signal as a function of the activated positive currents supplied by the activated first set of positive generator elements and the second output analog signal generated as a function of the negative current supplied by the activated second set of negative generator elements; and
updating the selected index according to the input code.

16. A method for digital-to-analog conversion of a digital input code into first and second analog output signals to be supplied to a first and second terminal of a load, respectively, the method performed by a digital-to-analog converter with an N-level balanced output, the converter including N/2 positive and negative generator elements configured to supply positive and negative currents, the positive currents nominally equal to one another and the negative currents nominally equal to one another, and, in absolute value, the positive and negative currents equal to each other, the converter having the same progressive addresses attributed to the positive and negative generator elements and further defining a first index for positive input codes and a second index for negative input codes; the method comprising:

receiving an input code at the input of the digital-to-analog converter;

selecting between the first index and a second index, the index selected corresponding to the sign of the input code;

in response to the input code, activating a first set of positive generator elements and a second set of negative generator elements, the number of negative and positive generator elements activated being equal to one another, the addresses of the activated positive and negative generator elements determined as a function of the selected index;

generating the first output analog signal as a function of the positive currents supplied by the activated first set of positive generator elements and the second output analog signal generated as a function of the negative current supplied by the activated second set of negative generator elements activated;

updating the selected index according to the input code; and supplying the first output signal and the second output signal to a first terminal and a second terminal of a load according to the sign of the input code.

17. A method for digital-to-analog conversion of a digital input code into first and second analog output signals to be supplied to a first and second terminal of a load, respectively, the method performed by a digital-to-analog converter having an N-level balanced output, the converter including N/2 positive generator elements and N/2 negative generator elements configured to supply positive and negative currents, the positive currents nominally equal to one another and the negative currents nominally equal to one another, and, in absolute value, the positive and negative currents equal to each other, the converter having the same progressive addresses attributed to the positive and negative generator elements and further defining a first index for positive input codes and a second index for negative input codes; the method comprising:

receiving an input code at the input of the digital-to-analog converter;

selecting between the first index and the second index, the index selected corresponding to the sign of the input code;

in response to the input code, activating a first set of positive generator elements and a second set of negative generator elements, the number of negative and positive generator elements activated being equal to one another, the addresses of the activated positive and negative generator elements determined as a function of the selected index;

generating the first output analog signal as a function of the positive currents supplied by the activated first set of positive generator elements and the second output analog signal generated as a function of the negative current supplied by the activated second set of negative generator elements;

updating the selected index according to the input code; and supplying the first output signal and the second output signal to a first terminal and a second terminal of a load according to the sign of the input code, further comprising:

when the sign of the input code is positive, applying the first output signal to the first terminal of the load and the second output signal to the second terminal of the load; and when the sign of the input code is negative, applying the first output signal to the second terminal of the load and the second output signal to the first terminal of the load.

18. A method for digital-to-analog conversion in a digital-to-analog converter having an N-level balanced output, the converter including N/2 positive generator elements and N/2 negative generator elements configured to supply positive and negative currents, respectively, the method comprising:

receiving an input code on an input of the digital-to-analog converter;

selecting between a first index and a second index associated with positive input codes and negative input codes, respectively, the selected index corresponding to the sign of the received input code;

in response to the selected index, activating a first set of positive generator elements and a second set of negative generator elements, the number of positive and negative generator elements activated being equal to one another, the addresses of the activated positive and negative generator elements determined as a function of the selected index;

generating the first output analog signal as a function of the positive currents supplied by the activated first set of positive generator elements and generating the second output analog signal as a function of the negative currents supplied by the activated second set of negative generator elements; and updating the selected index according to the input code.

\* \* \* \* \*